United States Patent
Saeki

(10) Patent No.: US 6,222,408 B1
(45) Date of Patent: *Apr. 24, 2001

(54) SYNCHRONOUS DELAY CIRCUIT

(75) Inventor: Takanori Saeki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,177

(22) Filed: Oct. 5, 1998

(30) Foreign Application Priority Data

Oct. 3, 1997 (JP) .................................................. 9-287743

(51) Int. Cl.$^7$ .................................................. H03H 11/26
(52) U.S. Cl. .......................................... 327/271; 327/277
(58) Field of Search .................................... 327/261, 262, 327/263, 264, 269, 270, 271, 276, 277, 281

(56) References Cited

U.S. PATENT DOCUMENTS

| 5,245,231 | 9/1993 | Kocis et al. | 307/606 |
| 5,699,003 | * 12/1997 | Saeki | 327/261 |
| 5,892,384 | 4/1999 | Yamada et al. | 327/277 |

FOREIGN PATENT DOCUMENTS 0 720 291    7/1996 (EP).

OTHER PUBLICATIONS

Y. Okajima et al., "Digital Delay Locked Loop and Design Technique for High Synchronous Interface", IEICE Trans. Electron., vol. E79–C, No. 6, Jun. 1996, pp. 798–807.

R.B. Watson et al., "Clock Buffer Chip with Absolute Delay Regulation Over Process and Environment Variations", IEEE, CICC (Custom Integrated Circuits Conference), 1992, pp. 25.2.1–25.2.5. (No Month Indication).

T. Yamada et al., "Capacitance coupled Bus with Negative Delay Circuits for High Speed and Low Power (10GB/s<500mW) Synchronous DRAMs", Symposium on VLSI Circuits Digest of Technical Papers, 1996, pp. 112–113. (No Month Indication).

Jin–Man Han et al., "Skew Minimization Technique for 256M–bit Synchronous DRAM and beyond", Symposium on VLSI Circuits Digest of Technical Papers, 1996, pp. 192–193. (No Month Indication).

* cited by examiner

*Primary Examiner*—Toan Tran
*Assistant Examiner*—Linh Nguyen
(74) *Attorney, Agent, or Firm*—Sughrue, Mion, Zinn, Macpeak & Seas, PLLC

(57) ABSTRACT

A synchronous delay circuit comprises a first delay circuit array 1 allowing a pulse or a pulse edge to progress during a constant time, a second delay circuit array 2 capable of allowing the pulse or the pulse edge to pass in the first delay circuit array by a length in proportion to a length by which the pulse or the pulse edge has progressed, and a latch delay circuit 5 for storing and reproducing a delay time of a clock driver. Thus, the clock pulse progresses in the latch delay circuit 5 and the delay circuit array 1 during the clock period tcK, so that the delay amount of tcK–(td1+td2) can be obtained with no clock driver dummy. Therefore, when the synchronous delay circuit is applied to the device such as ASIC having the clock delay amount different from one chip to another, it is no longer necessary to design the clock driver dummy for each interconnection design modification, and therefore, a design efficiency and a precision can be elevated.

11 Claims, 16 Drawing Sheets

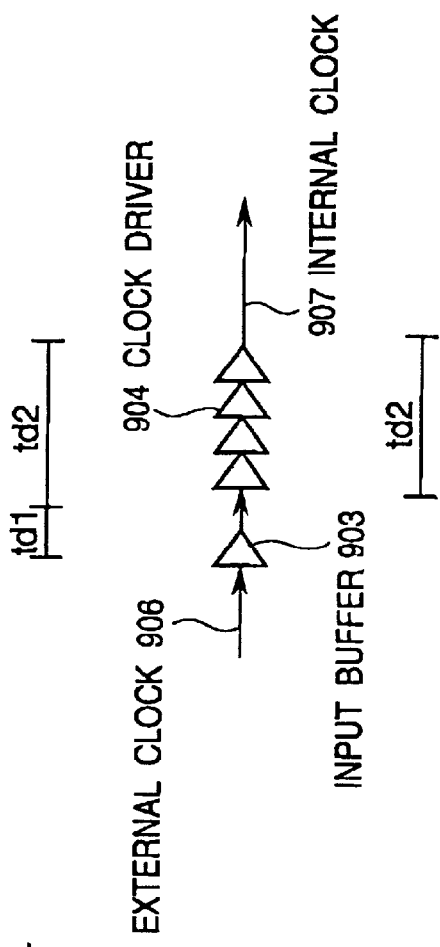
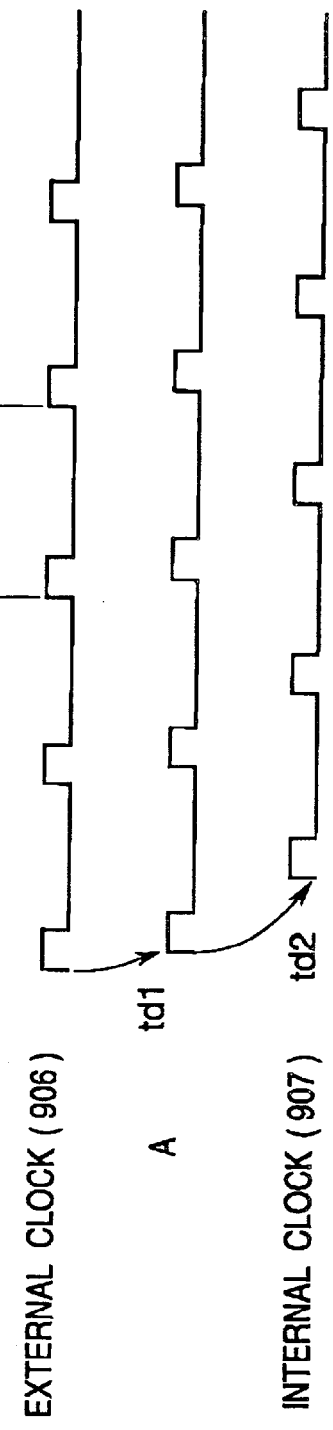
Fig. 14A PRIOR ART
Fig. 14B PRIOR ART

SYNCHRONOUS DELAY CIRCUIT

BACKGROUND OF THE INVENTION

1. Field of the Invention

The present invention relates to a semiconductor integrated circuit, and more specifically to a control circuit for a clock signal.

2. Description of Related Art

A synchronous delay circuit capable of removing a clock skew in a synchronizing time of a short time length, is used in a high speed synchronous circuit, from the viewpoint of a simple circuit construction and a small current consumption. As regards the prior art of the synchronous delay circuit, the following documents can be referred to:

(1) Japanese Patent Application Pre-examination Publication No. JP-A-08-237091 (corresponding to European Patent Application Pre-examination Publication No. EP-0 720 291-A2)
(2) Toshio Yamada et al, "Capacitance coupled Bus with Negative Delay Circuit for High Speed and Low Power (10 GB/s<500 mW) Synchronous DRAMs", 1996 Symp. on VLSI Circ. pp.112–113
(3) Jim-Man Han et al, "Skew Minimization Technique for 256M-bit Synchronous DRAM and beyond", 1996 Symp. on VLSI Circ. pp.192–193
(4) Richard B. Watson et al, "Clock Buffer Chip with Absolute Delay Regulation Over Process and Environment Variations", Proc. of IEEE 1992 CICC (Custom Integrated Circuits Conference) 25.2
(5) Yoshinori OKAJIMA et al, "Digital Delay Locked Loop and Design Technique for High-Speed Synchronous Interface", IEICE TRANS. ELECTRON., VOL.E79-C, NO.6, June 1996 pp.798–807.

The content of the above documents are incorporated by reference in its entirety into this application.

A basic construction of the prior art synchronous delay circuit is shown in FIG. 9. Referring to FIG. 9, the prior art synchronous delay circuit includes two delay circuit arrays composed of a delay circuit array 901 used for measuring a predetermined time difference and a delay circuit array 902 for reproducing the measured delay time, and also includes a dummy delay circuit 905 having a delay time td1+td2 corresponding to the sum of respective delay times td1 and td2 of an input buffer 903 and a clock driver 904. In many cases, as shown in FIG. 9, the dummy delay circuit 905 includes an input buffer dummy 905A which is completely the same as that input buffer, and a clock driver dummy 905B, in order to equalize the delay time equal to the delay times td1 and td2 of the input buffer 903 and the clock driver 904.

Now, classification of the prior art synchronous delay circuit will be described. The delay circuit array 901 and the delay circuit array 902 are formed of delay circuit arrays having the same delay time. The purpose of the delay circuit array 901 and the delay circuit array 902 is to measure a predetermined period of time by means of the delay circuit array 901 and to reproduce the predetermined of time by means of the delay circuit array 902. Namely, during a period of time to be measured, a signal is progressed in the delay circuit array 901, and a period of time equal to the measuring period is reproduced by causing a signal to pass through delay elements of the same number as that of the delay elements through which the first named signal has progressed.

A system in which a signal is caused to pass in the delay circuit array 902 the delay elements of the same number as that of the delay elements through which a signal has progressed in the delay circuit array 901, can be classified to two, on the basis of the signal progressing directions of the delay circuit array 901 and the delay circuit array 902. In addition, this system can also divided into two, on the basis of which of an end of the path and the whole of the path is selected for determining the length of the delay circuit array 902. Therefore, it can be classified into four types.

Namely, if the system is classified on the basis of the signal progressing directions of the delay circuit array 901 and the delay circuit array 902, it is classified into one in which as shown in FIG. 12 and FIG. 13, the respective signal progressing directions of the delay circuit array 901 and the delay circuit array 902 are the same, and the number of delay elements in the delay circuit arrays 902 is determined by an output terminal side of the delay circuit array 902, and another in which as shown in FIG. 10 and FIG. 11, the respective signal progressing directions of the delay circuit array 901 and the delay circuit array 902 are opposite to each other, and the number of delay elements in the delay circuit arrays 902 is determined by an input terminal side of the delay circuit array 902, As regard which of an end of the path and the whole of the path is selected for determining the length of the delay circuit array 902, it is classified into a system for selecting the end of the path as shown in FIGS. 10 and 11, and another system for selecting the whole of the path shown in FIGS. 12 and 13.

FIG. 10 corresponds to the system shown in JP-A-08-237091 (EP-0 720 291-A2), and FIG. 11 corresponds to the system shown in the above referred document (5) IEICE TRANS. ELECTRON., VOL.E79-C, NO.6, June 1996 pp.798–807. FIG. 12 corresponds to the above referred document (3) 1996 Symp. on VLSI Circ. pp.192–193, and FIG. 13 corresponds to the above referred document (2) 1996 Symp. on VLSI Circ. pp.112–113 and the above referred document (4) Proc. of IEEE 1992 CICC (Custom Integrated Circuits Conference) 25.2.

Now, an operation of the prior art synchronous delay circuit will be described.

An operation for removing a clock skew will be described with reference to FIGS. 14A and 14B and FIGS. 15A and 15B.

(1) Clock delay in the case of using a synchronous delay circuit

In the circuit shown in FIG. 14A using no synchronous delay circuit, an external clock 906 passes through an input buffer 903 and a clock driver 904, and is outputted as an internal clock 907. In this process, a time difference between the external clock and the internal clock is a sum of a delay time td1 of the input buffer 903 and a delay time td2 of the clock driver 904. Namely, td1+td2 becomes the clock skew.

(2) Principle for removing the clock delay in the case of using a synchronous delay circuit In order to effectively remove this clock skew, the synchronous delay circuit utilizes the feature that the clock pulse is inputted at every clock period tcK. Namely, a delay circuit having a delay time of tcK−(td1+td2) is prepared, and the delay circuit is located between the input buffer (having the delay time td1) and the clock driver (having the delay time td2), so that a total delay time becomes the clock period tcK (=td1+tcK−(td1+td2)+td2). As a result, the timing of the internal clock outputted from the clock driver becomes equal to the timing of the external clock.

(3) Method for removing the clock delay in the case of using a synchronous delay circuit The synchronous delay circuit shown in FIG. 15A is the same circuit construction as that shown in FIG. 9, and FIG.

15B shows a timing chart for illustrating an operation of the synchronous delay circuit. In FIG. 15B, "A", "B" and "C" show signal waveforms on an output of the input buffer 903, an output of the dummy delay circuit 905 and an output node of the second delay circuit 902, respectively.

The operation of the synchronous delay circuit requires two periods. A first period is used to measure the delay time tcK−(td1+td2) depending upon the clock period, and to determine the delay length of the delay circuit for reproducing the delay amount of tcK−(td1+td2). A second period is used for use the obtained delay amount of tcK−(td1+td2).

First, in the first delay time, in order to measure the delay time tcK−(td1+td2) depending upon the clock period, the dummy delay circuit 905 of the clock driver 904 and the delay circuit array 901 are used. During one clock period tcK from the moment a first pulse of two continuous pulses of the external pulse 906 is outputted from the input buffer 903 to the moment a second pulse of the two continuous pulses synchronous delay circuit is outputted from the input buffer 903, a clock is caused to progress in the dummy delay circuit 905 and the delay circuit array 901.

Since the delay time of the dummy delay circuit 905 is td1−td2, the time by which the pulse progresses in the delay circuit array 901 becomes tcK−(td1+td2).

Therefore, the delay time of the delay circuit array 902 is set to become equal to tcK−(td1+td2) by the pulse progresses in the delay circuit array 901.

The method for setting this delay time of the delay circuit array 902 is generally divided into four as mentioned above, but a desired object can be achieved by each of the four method.

In the next period, the clock outputted from the input buffer 903 passes through the delay circuit 903 having the delay time of tcK−(td1+td2), and outputted from the clock driver 903 so that an internal clock having the delay time tcK is generated.

In the above mentioned process, the internal clock 907 having no clock skew is generated with two clock periods.

In the above mentioned prior art synchronous delay circuits, since the dummy delay amount of the clock is fixed, it is necessary to estimate the fixed delay amount. Therefore, in a device such as a microprocessor and a memory device capable of previously estimating the clock delay amount, since the design of transistors to interconnections is carried out in bundle, it is relatively easy to design the clock driver dummy.

However, in the case of using the synchronous delay circuit as a macro in ASIC (application specific integrated circuit), a transistor gate process for designing the dummy delay circuit and an interconnection process dominating an actual clock delay are separate in design, so that the clock delay amount is different from one interconnection design used in the chip to another. In this device, it is difficult to design the clock dummy delay circuit, and therefore, it becomes necessary to design the dummy delay circuit after the interconnection are located. As a result, the efficiency is very bad.

Accordingly, the pattern previously designed as the macro becomes only the delay circuit array 901 and the delay circuit array 902, and therefore, it is necessary to ensure a region for the dummy clock driver 905B in a layout. This is very uneconomical.

In addition, even in the device such as the microprocessor and the memory device capable of previously estimating the clock delay amount, the delay amount of the clock driver dummy and the delay amount of the clock driver have a difference in a temperature dependency of the delay time and in a temperature dependency of a power supply voltage, as shown in FIGS. 16A and 16B, and it is very difficult to make these characteristics completely coincident with each other. Accordingly, the difference between the delay amount of the clock driver dummy and the delay amount of the original clock driver becomes an error in the skew removal.

SUMMARY OF THE INVENTION

Accordingly, it is an object of the present invention to provide a synchronous delay circuit which has overcome the above mentioned problems, and which makes the dummy delay circuit of the clock driver unnecessary, so that it becomes unnecessary to design the clock driver dummy for each interconnection design modification, even if the synchronous delay circuit is sued in a device such as ASIC having the clock delay amount different from one chip to another, whereby the design efficiency can be elevated.

Another object of the present invention is to provide a synchronous delay circuit capable of eliminating a clock skew caused by a difference in delay amount between the clock driver dummy and the original clock driver, even if the delay amount of the clock driver varies upon a temperature change, whereby a high precision and an elevated reliability can be realized.

The above and other objects of the present invention are achieved in accordance with the present invention by a synchronous delay circuit comprising a first delay circuit array allowing a pulse or a pulse edge to progress during a constant time, a second delay circuit array capable of allowing the pulse or the pulse edge to pass by a length in proportion to a length by which the pulse or the pulse edge has progressed in the first delay circuit array, and a circuit means for storing and reproducing the period in which a clock pulse progresses in a clock driver.

In a preferred embodiment, the synchronous delay circuit in accordance with the present invention includes a first delay circuit array (1 in FIG. 1) allowing a pulse or a pulse edge to progress during a constant time, a second delay circuit array (2 in FIG. 1) capable of allowing the pulse or the pulse edge to pass by a length in proportion to a length by which the pulse or the pulse edge has progressed in the first delay circuit array, and a latch delay circuit (9 in FIG. 1) for storing and reproducing the period in which a clock pulse progresses in a clock driver (4 in FIG. 1). An external clock (5 in FIG. 1) is inputted through an input buffer (3 in FIG. 1) to the clock driver (4 in FIG. 1), so as to be outputted as an internal clock signal (7 in FIG. 1). The external clock passes through the first and second delay circuit arrays (1 and 2 in FIG. 1) and outputted from the second delay circuit array (2 in FIG. 1) by the time (tcK−(td1+td2) obtained by subtracting from a clock period tcK the sum of a delay time (td2) of the clock driver (4 in FIG. 1) and a delay time (td1) of an input buffer dummy (6 in FIG. 1), so as to supply the delayed clock pulse to the first delay circuit array, and further, is supplied through a selector circuit (10 in FIG. 1) to the clock driver (4 in FIG. 1). Thus, the internal clock signal can be synchronized with the external clock even if the input clock driver (4 in FIG. 1) has any delay time.

In another preferred embodiment, the synchronous delay circuit in accordance with the present invention includes, in addition to a clock driver (20 in FIG. 5) and an input buffer (19 in FIG. 5), first and second delay circuit arrays (11 and 12 in FIG. 5) having signal progressing directions opposite to each other, and an output terminal of the delay circuit array (12 in FIG. 5) of the reversed signal progressing direction is determined at a time point where the clock pulse has progressed in the one delay circuit array (11 in FIG. 5) by a sum (td2+td1) of a delay time of the clock driver (20 in FIG. 5) and a delay time of the input buffer (19 in FIG. 5), and an input terminal of the delay circuit array (12 in FIG. 5) is determined at a time point where the clock pulse has progressed by one clock period.

More specifically, the synchronous delay circuit includes a means (an array of latch circuits 16 and an array of switches 17 in FIG. 5) for determining an output terminal of the second delay circuit array (12 in FIG. 5) at a time point where the clock pulse outputted from the input buffer (19 in FIG. 5) has progressed in the first delay circuit array (11 in FIG. 5) by a sum (td2+td1) of a delay time of the clock driver (20 in FIG. 5) and a delay time of the input buffer (22 in FIG. 5), and a means (an array of transfer gates in FIG. 5) for determining an input terminal of the second delay circuit array (11 in FIG. 5) receiving the clock pulse transferred from the first delay circuit array (11 in FIG. 5), at a time point where the clock pulse outputted from the input buffer (19 in FIG. 5) has progressed in the first delay circuit array (11 in FIG. 5) by one clock period tcK.

In still another preferred embodiment, the synchronous delay circuit in accordance with the present invention includes, in addition to a clock driver (20 in FIG. 6) and an input buffer (19 and 22 in FIG. 6), first and second delay circuit arrays (14 and 11 in FIG. 6) having the same forward signal progressing direction, and a third delay circuit array (12 in FIG. 6) having a reversed signal progressing direction, and an output terminal of the third delay circuit array (12 in FIG. 6) is determined at a time point where the clock pulse has progressed in the first delay circuit array (14 in FIG. 6) by a sum (td2+td1) of a delay time of the clock driver (20 in FIG. 6) and a delay time of the input buffer (22 in FIG. 6), and an input terminal of the third delay circuit array (12 in FIG. 6) is determined at a time point where the clock pulse has progressed in the second delay circuit array (11 in FIG. 6) by one clock period. More specifically, the synchronous delay circuit includes a means (16 and 17 in FIG. 6) for determining an output terminal of the third delay circuit array (12 in FIG. 6) at a time point where the clock pulse outputted from the input buffer (19 in FIG. 6) has progressed in the first delay circuit array (14 in FIG. 6) by a sum (td2+td1) of a delay time of the clock driver (20 in FIG. 6) and a delay time of the input buffer (22 in FIG. 6); and a means (an array of transfer gates in FIG. 6) for determining an input terminal of the third delay circuit array (12 in FIG. 6) receiving the clock pulse transferred from the second delay circuit array (11 in FIG. 6), at a time point where the clock pulse outputted from the input buffer (19 in FIG. 6) has progressed in the second delay circuit array (11 in FIG. 6) by one clock period tcK.

In a further embodiment, the synchronous delay circuit in accordance with the present invention includes, in addition to a clock driver (20 in FIG. 8) and an input buffer (19 and 22 in FIG. 8), first and second delay circuit arrays (11 and 12 in FIG. 8) having signal progressing directions opposite to each other, an input terminal of the second delay circuit array (12 in FIG. 8) is determined at a time point where the clock pulse has progressed in the first delay circuit array (11 in FIG. 8) by a sum (td2+td1) of a delay time of the clock driver (20 in FIG. 8) and a delay time of the input buffer (22 in FIG. 8), and an output terminal of the second delay circuit array (12 in FIG. 8) is determined at a time point where the clock pulse has progressed in the first delay circuit array (11 in FIG. 8) by one clock period. More specifically, the synchronous delay circuit includes a means (16 and 17 in FIG. 8) for determining an input terminal of the second delay circuit array (12 in FIG. 8) for receiving the clock pulsed from the input buffer (19 in FIG. 8) at a time point where the clock pulse outputted from the input buffer (19 in FIG. 8) has progressed in the first delay circuit array (11 in FIG. 8) by a sum (td2+td1) of a delay time of the clock driver (20 in FIG. 8) and a delay time of the input buffer (22 in FIG. 8), and a means (25 and 26 in FIG. 8) for determining an output terminal of the second delay circuit array (12 in FIG. 8), at a time point where the clock pulse outputted from the input buffer (19 in FIG. 8) has progressed in the first delay circuit array (11 in FIG. 8) by one clock period tcK.

In a still further preferred embodiment, the synchronous delay circuit in accordance with the present invention includes, in addition to a clock driver (20 in FIG. 7) and an input buffer (19 and 22 in FIG. 7), three delay circuit arrays (14, 11 and 12 in FIG. 7) having the same signal progressing directions, and an input terminal of the third delay circuit array (12 in FIG. 7) is determined at a time point where the clock pulse has progressed in the first delay circuit array (14 in FIG. 7) by a sum (td2+td1) of a delay time of the clock driver (20 in FIG. 7) and a delay time of the input buffer (22 in FIG. 7), and an output terminal of the third delay circuit array (12 in FIG. 7) is determined at a time point where the clock pulse has progressed in the second delay circuit array (11 in FIG. 7) by one clock period. More specifically, the synchronous delay circuit includes a means (16 and 17 in FIG. 7) for determining an input terminal of the third delay circuit array at a time point where the clock pulse outputted from the input Buffer (19 in FIG. 7) has progressed in the first delay circuit array (14 in FIG. 7) by a sum (td2+td1) of a delay time of the clock driver (20 in FIG. 7) and a delay time of the input buffer (22 in FIG. 7), and a means (25 and 26 in FIG. 7) for determining an output terminal of the third delay circuit array (12 in FIG. 7), at a time point where the clock pulse outputted from the input buffer (19 in FIG. 7) has progressed in the second delay circuit array (11 in FIG. 7) by one clock period tcK.

The above and other objects, features and advantages of the present invention will be apparent from the following description of preferred embodiments of the invention with reference to the accompanying drawings.

BRIEF DESCRIPTION OF THE DRAWINGS

FIG. 14A is a circuit diagram illustrating the construction of a circuit having no synchronous delay circuit;

FIG. 14B is a timing chart of illustrating an operation of the circuit having no synchronous delay circuit;

DESCRIPTION OF THE PREFERRED EMBODIMENTS

Now, embodiments of the synchronous delay circuit in accordance with the present invention will be described in detail with reference to the drawings.

Figure 1:
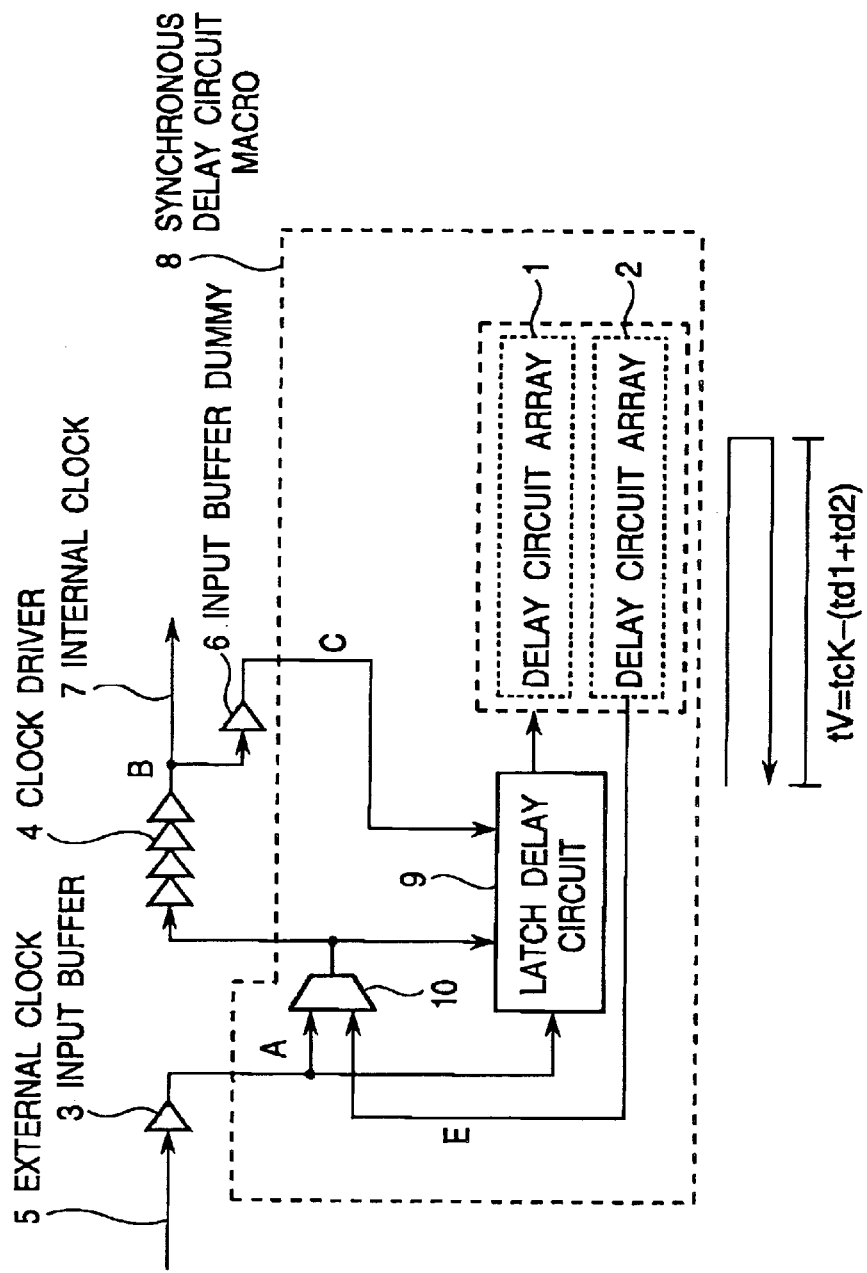
FIG. 1 is a circuit diagram illustrating a fundamental principle of the synchronous delay circuit in accordance with the present invention.
Figure 2:
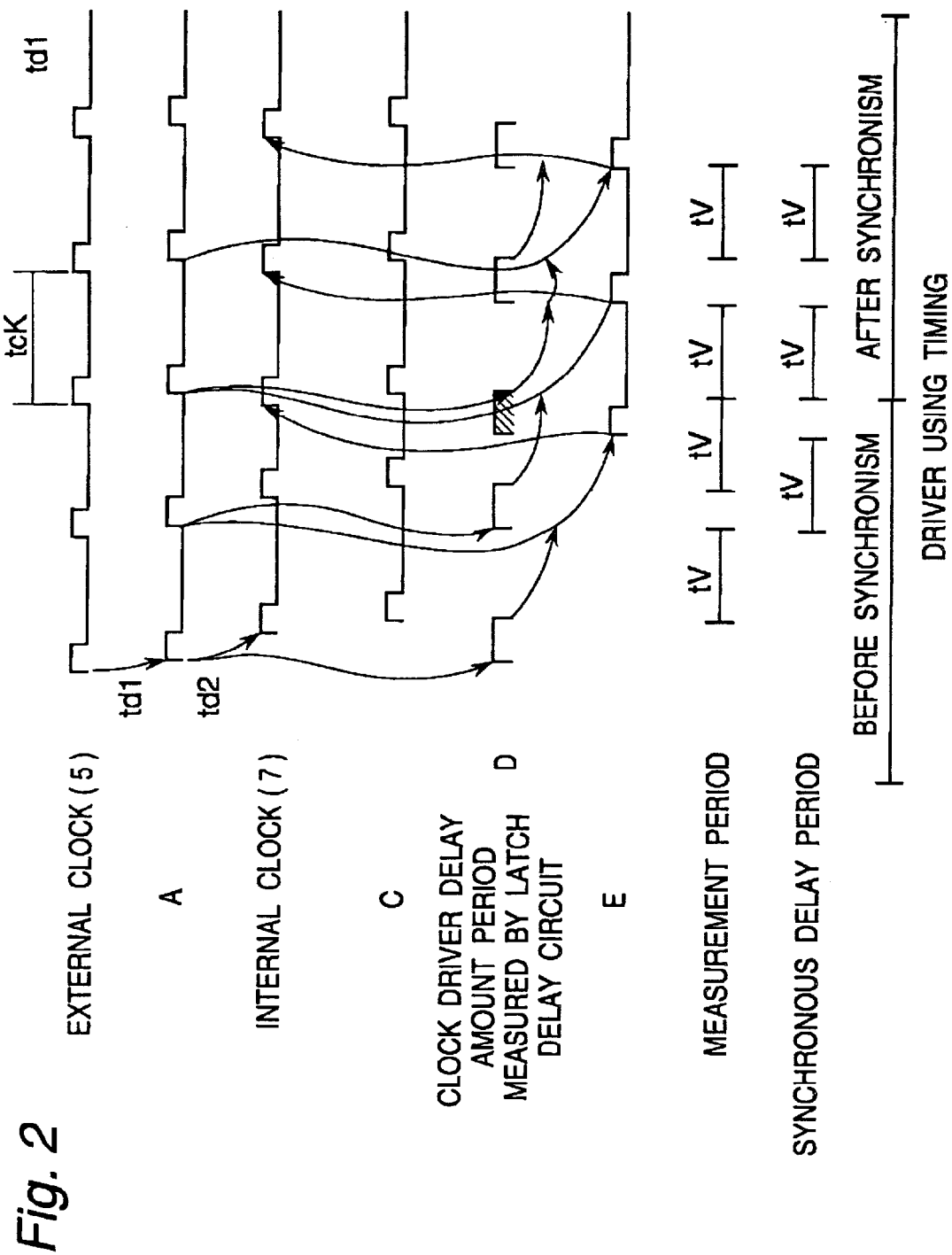
FIG. 2 is a timing chart illustrating an operation of the synchronous delay circuit in accordance with the present invention.

FIG. 1 is a circuit diagram illustrating a fundamental principle of the synchronous delay circuit in accordance with the present invention, and FIG. 2 is a timing chart illustrating an operation of the synchronous delay circuit in accordance with the present invention.

Referring to FIG. 1, the embodiment of the synchronous delay circuit in accordance with the present invention includes a delay circuit array 1 for measuring a constant length of time, a delay circuit array 2 for reproducing the measured delay time, an input buffer 3, a clock driver 4, a latch delay circuit 9 for storing and reproducing the constant time, a selector 10 and an input buffer dummy 6, which are connected as shown.

The latch delay circuit 9 measures the delay time td2 of the clock driver 4, and measures the clock period tcK by causing a signal to pass through the input buffer dummy 6, the latch delay circuit 9 and the delay circuit array 1.

Therefore, a period tV in which the signal progresses in the delay circuit array 1 becomes a time tcK−(td1+td2) obtained by subtracting from the clock period tcK the time obtained by reproducing the delay time td1 of the input buffer dummy 6 and the delay time td2 of the clock driver 4 by the latch delay circuit 9. Accordingly, the delay time tV reproduced in the delay circuit array 2 becomes tcK−(td1+td2).

The delay circuit arrays 1 and 2, the latch delay circuit 9 and the selector 10 are realized as a synchronous delay circuit macro 8. In addition, the delay time of the clock driver is stored and reproduced in the latch delay circuit 9. Therefore, a clock driver dummy becomes unnecessary, and the synchronous delay circuit macro 8 can be applied to a clock driver having any delay time.

Embodiment 1

Figure 3:
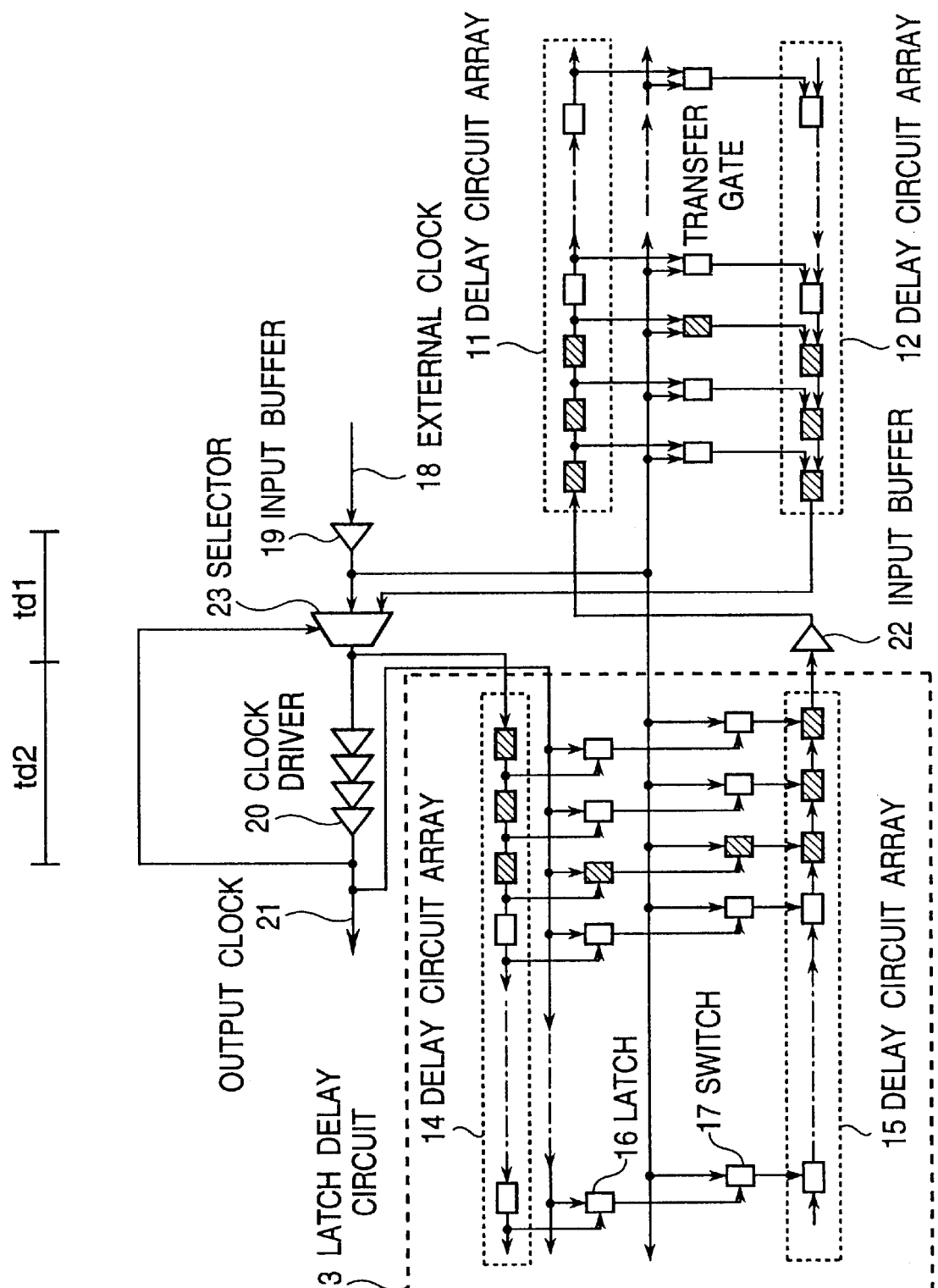
FIG. 3 is a circuit diagram illustrating the construction of a first embodiment of the synchronous delay circuit in accordance with the present invention.

FIG. 3 is a circuit diagram illustrating the construction of a first embodiment of the synchronous delay circuit in accordance with the present invention.

The shown embodiment includes input buffers 19 and 22, a clock driver 20, a selector 23, a pair of delay circuit arrays in a forward signal progressing direction and in a reversed signal progressing direction, respectively, and a latch delay circuit 13. The forward signal progressing direction delay circuit array and the reversed signal progressing direction delay circuit array are constituted of a delay circuit array 11 for measurement and a delay circuit array 12 for reproducing the measured period.

The latch circuit 13 includes a delay circuit array 14 for measurement, a delay circuit array 15 for reproducing the measured period, and an array of latch circuits 16 and an array of switches 17 for determining a time point (td2) by which the clock pulse progresses in the delay circuit array 14 by a time in which the clock pulse progresses in the clock driver (clock buffer) 20 and an input terminal of the delay circuit array 15. The clock pulse is inputted to the delay circuit array 14 having a number of cascaded delay elements. In the array of latch circuits 16 having an input receiving an output of the clock driver 20, a latch circuit (hatched in the drawing) positioned at a position where the clock pulse progresses in the delay circuit array 14 by a delay time (td2) of the clock driver 20, is enabled. In the array of switches 17 controlled by an output of the array of latch circuits 16, respectively, only the switch 17 (hatched in the drawing) controlled by an output of the enabled latch circuit is turned on. Since the array of switches 17 are connected between the output of the input buffer 19 and respective cascaded delay elements of the delay circuit array is, respectively, the output of the input buffer 19 is applied through the turned-on switch 17 to the delay circuit array 15, so that after the output of the input buffer 19 progresses in the delay circuit array 15 by the time td2, the output of the input buffer 19 is outputted from the delay circuit array 15, and supplied through the input buffer 22 (having the delay time td1) to the delay circuit array 11.

Figure 11:
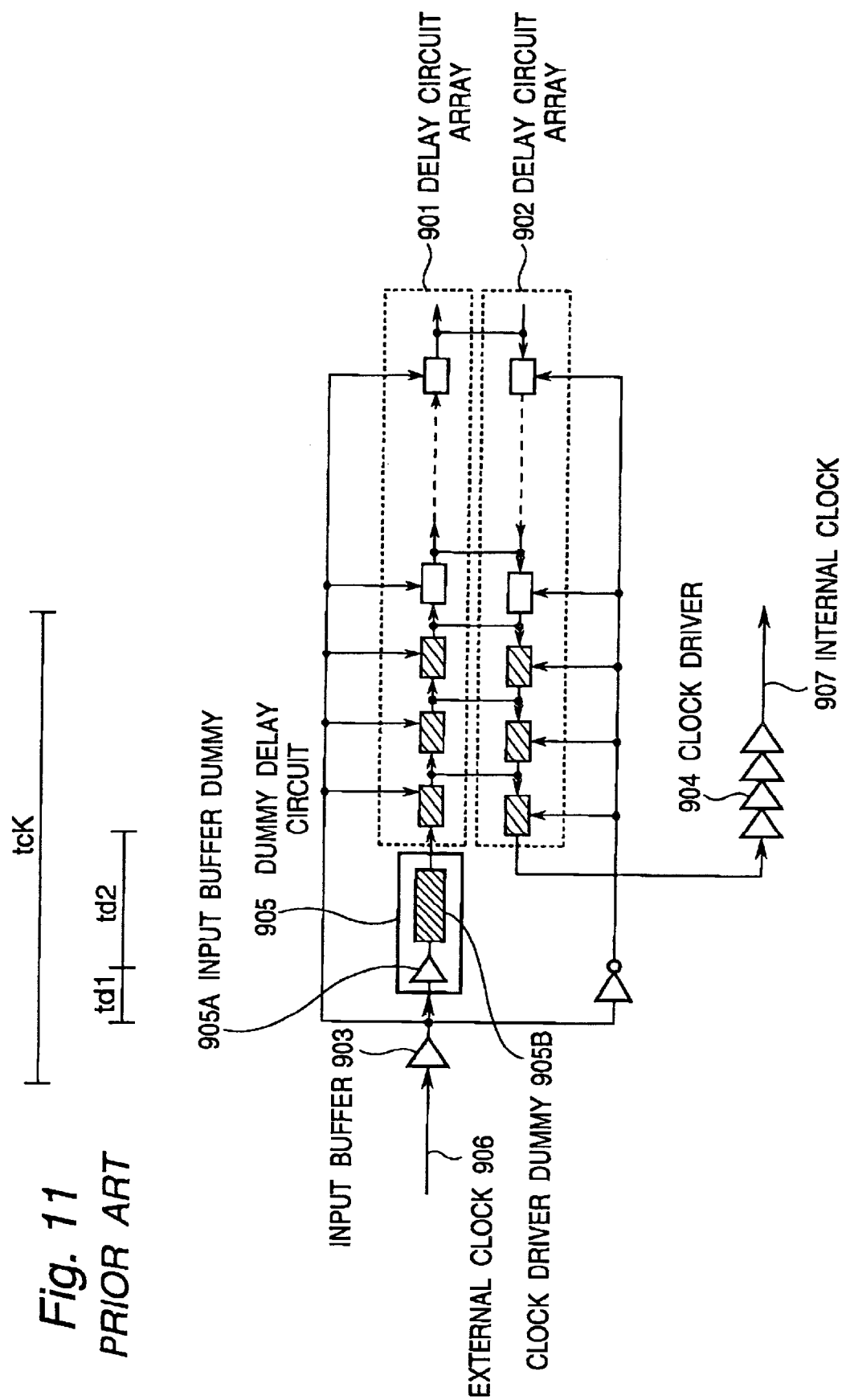
FIG. 11 is a circuit diagram illustrating the construction of a third example of the prior synchronous delay circuit.
Figure 12:
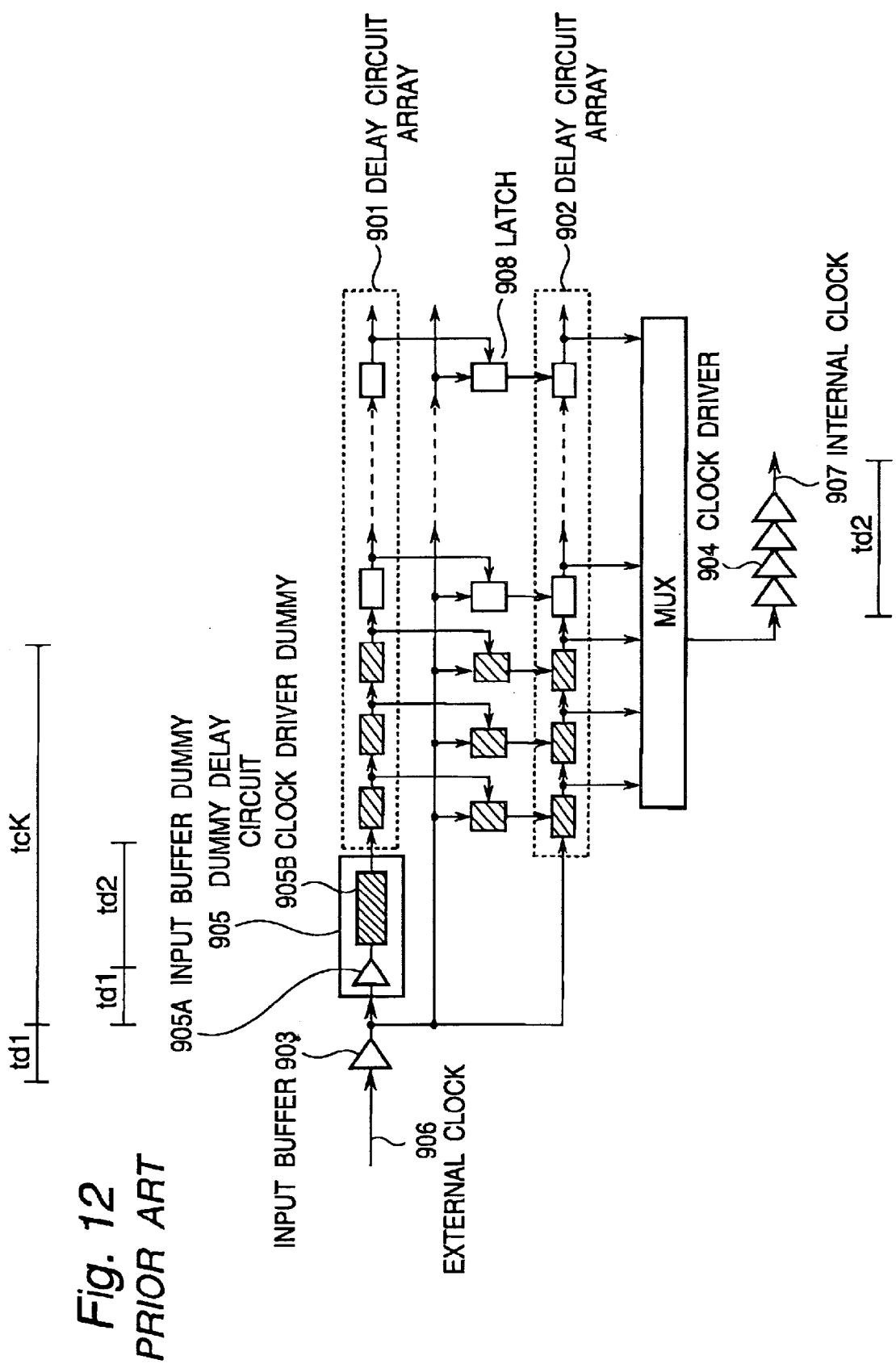
FIG. 12 is a circuit diagram illustrating the construction of a fourth example of the prior synchronous delay circuit.

In the system in which the delay circuit array 11 for the period measurement and the delay circuit array 12 for reproducing the measured period, are located in opposite signal progressing directions to each other, the clock pulse outputted from the input buffer 22 progresses in a number of cascaded delay elements of the delay circuit array 11, and when a next clock pulse is outputted from the input buffer 19, the clock pulse progressing in the delay circuit array 11 is transferred to the delay circuit array 12 (composed of a number of cascaded delay elements) through a selected one of an array of transfer gates, since the array of transfer gates are connected between the cascaded delay elements of the delay circuit array 11 and the corresponding cascaded delay elements of the delay circuit array 12, respectively, and are controlled in common by the output of the input buffer 19. This system corresponds to the system disclosed by JP-A-08-237091 (EP-0 720 291-A2) and explained with reference to FIG. 11. The detail of the delay circuit arrays 11 and 12 and the array of transfer gates will be referred to the disclosure of JP-A-08-237091 (EP-0 720 291-A2).

Thus, the length of time in which the external clock 18 propagates through the input buffer 19, the latch delay circuit 13, the two delay circuit arrays and the clock driver 20 so that it is outputted as the internal clock 21, requires just two clocks, and therefore, no substantial slew exists between the external clock and the internal clock.

As shown in the drawing, the circuit having no clock skew is switched from the ordinary clock by the selector 23.

Figure 4:
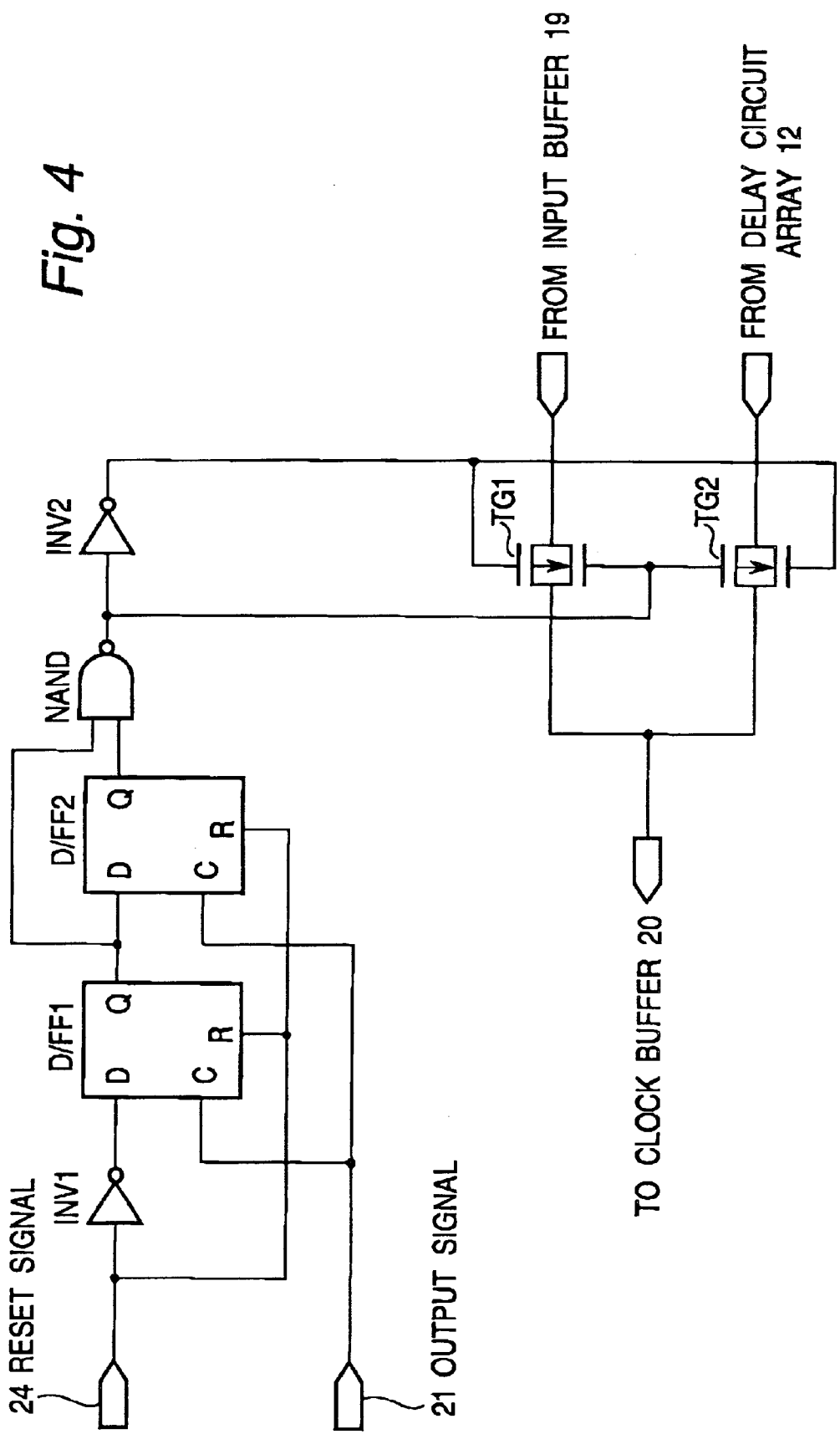
FIG. 4 is a circuit diagram of the construction of a selector in the first embodiment of the synchronous delay circuit.

A circuit diagram of one example of the construction of the selector 23 shown in FIG. 3 is shown in FIG. 4. Referring to FIG. 4, the shown selector includes a D-type flipflop D/FF1 with a reset function, having an data input terminal D receiving from an inverter INV1 an inverted signal of a reset signal 24, and another D-type flipflop D/FF2 with a reset function, having an data input terminal D connected to a Q output of the D-type flipflop D/FF1. The output clock 21 is supplied in common to a clock terminal C of D/FF1 and D/FF2. The selector also includes an NAND gate NAND receiving the Q output of the D-type flipflop D/FF1 and a Q output of the D-type flipflop D/FF2, CMOS transfer gates TG1 and TG2 receiving the output of the input buffer 19 and the output of the delay circuit array 12, respectively. A gate of an NMOS transistor of the transfer gate TG1 and a gate of a PMOS transistor of the transfer gate TG2 are connected in common to an output of the NAND gate NAND, and a gate of a PMOS transistor of the transfer gate TG1 and a gate of an NMOS transistor of the transfer gate TG2 are connected in common to receive from an inverter INV2 an inverted signal of the output of the NAND gate NAND. Thus, the transfer gates TG1 and TG2 are controlled to switch from the output of the input buffer 19 to the output of the delay circuit array 12 with two clocks (two output clocks 21) after the reset signal 24.

In brief, the reset signal 24 is activated to a high level for example at a power-on time, so that D/FF1 and D/FF2 are reset, with the result that the transfer gate TG2 is turned off and the transfer gate TG1 is turned on so as to select the output of the input buffer 19 so that the clock signal is supplied to the clock buffer (driver) 20. If two output clocks 21 are supplied, both the inputs of the NAND gates NAND are brought to the high level, so that the output of the NAND gate NAND is brought to the low level, with the result that the transfer gate TG1 is turned off and the transfer gate TG2 is turned on so as to select the output of the delay circuit 12 so that the output of the delay circuit 12 is supplied to the clock buffer 20.

Embodiment 2

Figure 5:
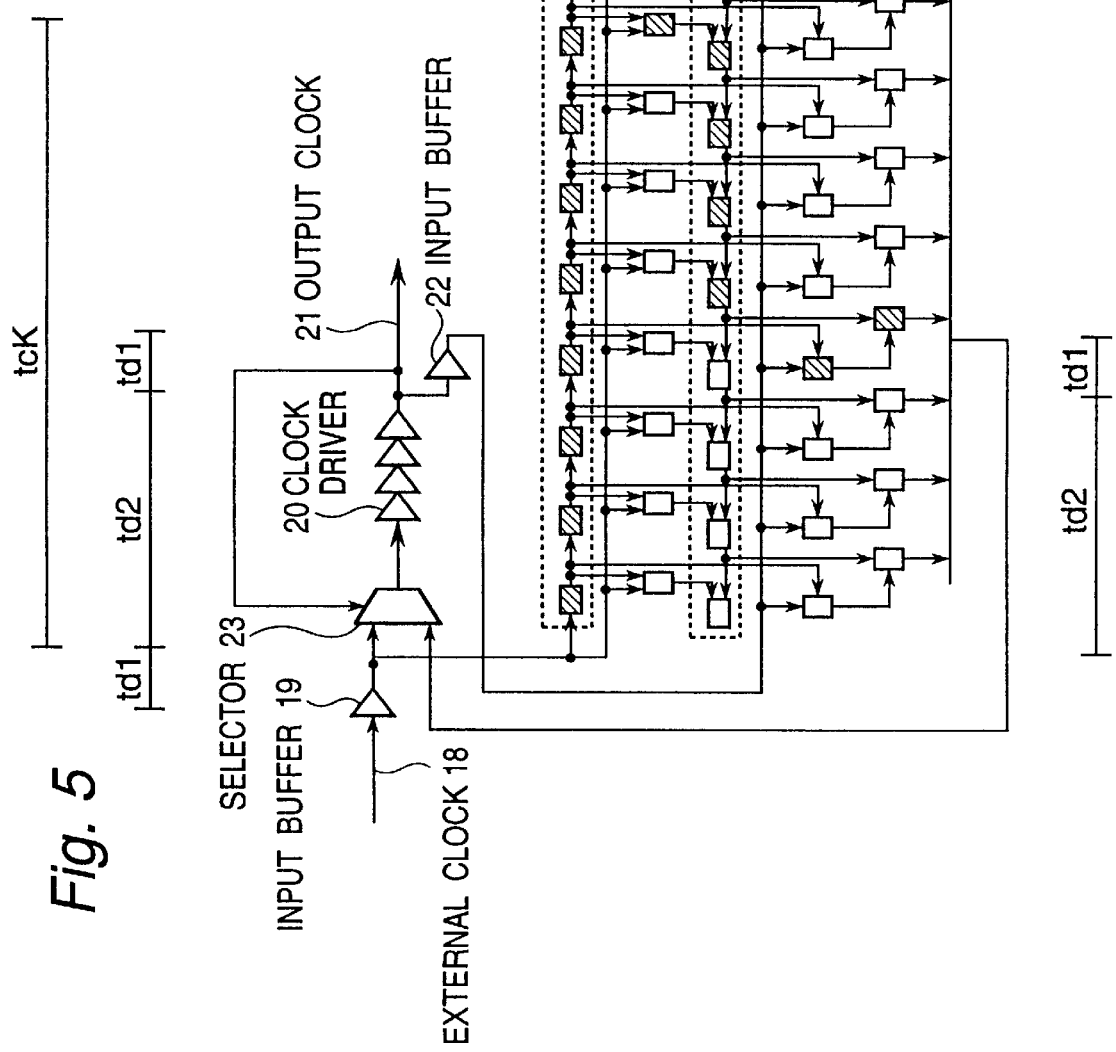
FIG. 5 is a circuit diagram illustrating the construction of a second embodiment of the synchronous delay circuit in accordance with the present invention.

FIG. 5 is a circuit diagram illustrating the construction of a second embodiment of the synchronous delay circuit in accordance with the present invention.

Referring to FIG. 5, the second embodiment includes, in addition to the clock driver (clock buffer) 2, the input buffers 19 and 22 and the selector 23, a forward signal progressing direction delay circuit array 11 for measurement, a reversed signal progressing direction delay circuit array 12 for reproducing the measured period, and a latch delay circuit 13.

In this embodiment, the latch delay circuit is not clearly indicated, but the delay circuit array 14 for the measurement and the delay circuit array 15 for reproducing the measured period in the latch delay circuit 13 shown in FIG. 3 are in common to the delay circuit array 11 for the measurement and the delay circuit array 12 for reproducing the measured period. An array of switches 17 and an array of latch circuits 16 determine an output terminal of the reversed signal progressing direction delay circuit array 12 at a time point (td2+td1) where the clock pulse has progressed in the measuring delay circuit array 11 by the delay times of the clock driver 20 and the input buffer 22.

This system is the system in which the delay circuit array 11 and the delay circuit array 12 for reproducing the measured period are located in opposite signal progressing directions to each other, and the clock pulse progresses in the delay circuit array 11 and is transferred to the delay circuit array 12 through a transfer circuit (transfer gate hatched in FIG. 5) when a next clock pulse is outputted from the input buffer 19 is outputted. This system corresponds to the system disclosed by JP-A-08-237091 (EP-0 720 291-A2), and therefore, the detail should be referred to the disclosure of JP-A-08-237091 (EP-0 720 291-A2).

Thus, similarly to the first embodiment, the length of time in which the external clock 18 propagates through the input buffer 19, the latch delay circuit 13, the two delay circuit arrays 11 and 12 and the clock driver 20 so that it is outputted as the internal clock 21, requires just two clocks, and therefore, no substantial slew exists between the external clock and the internal clock.

Embodiment 3

Figure 6:
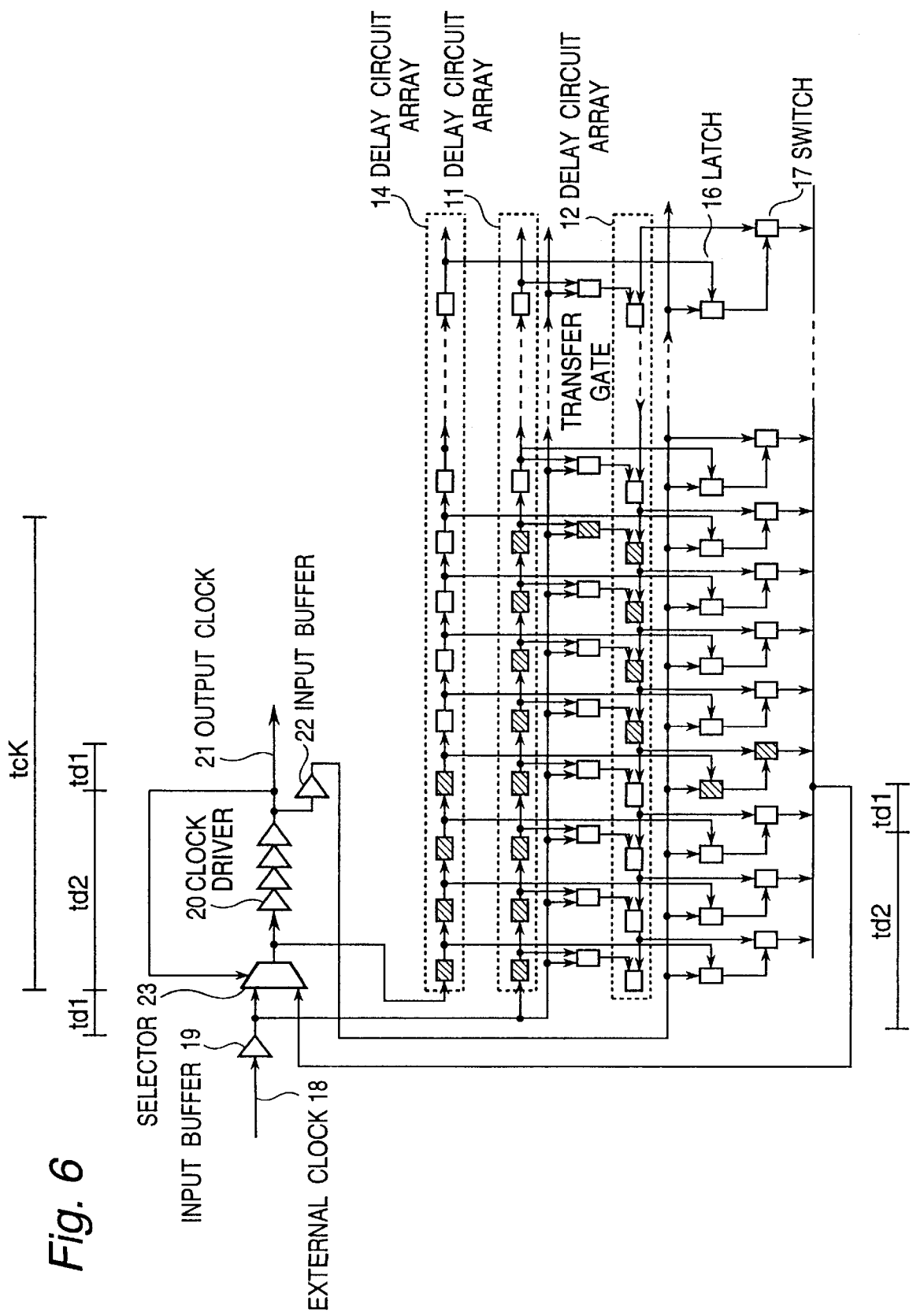
FIG. 6 is a circuit diagram illustrating the construction of a third embodiment of the synchronous delay circuit in accordance with the present invention.

FIG. 6 is a circuit diagram illustrating the construction of a third embodiment of the synchronous delay circuit in accordance with the present invention.

Referring to FIG. 6, the third embodiment includes, in addition to the clock driver (clock buffer) 2, the input buffers 19 and 22 and the selector 23, a forward signal progressing direction delay circuit array 11 for measurement, a reversed signal progressing direction delay circuit array 12 for reproducing the measured period, and a latch delay circuit 13.

In this embodiment, the latch delay circuit is not clearly indicated, but the delay circuit array 15 for reproducing the measured period in the latch delay circuit 13 shown in FIG. 3 is in common to the delay circuit array 12 for reproducing the measured period. In addition, the latch delay circuit 13 in this embodiment includes a delay circuit array 14 for measurement. An array of switches 17 and an array of latch circuits 16 determine an output terminal of the reversed signal progressing direction delay circuit array 12 at a time point (td2+td1) where the clock pulse has progressed in the measuring delay circuit array 14 by the delay times of the clock driver 20 and the input buffer 22.

This system is the system in which the delay circuit array 11 and the delay circuit array 12 for reproducing the measured period are located in opposite signal progressing directions to each other, and the clock pulse progresses in the delay circuit array 11 and is transferred to the delay circuit array 12 through a transfer circuit (transfer gate hatched in FIG. 6) when a next clock pulse is outputted from the input buffer 19 is outputted. This system corresponds to the system disclosed by JP-A-08-237091 (EP-0 720 291-A2), and therefore, the detail should be referred to the disclosure of JP-A-08-237091 (EP-0 720 291-A2).

Thus, similarly to the first embodiment, the length of time in which the external clock 18 propagates through the input buffer 19, the two delay circuit arrays 11 and 12 and the clock driver 20 so that it is outputted as the internal clock 21, requires just two clocks, and therefore, no substantial slew exists between the external clock and the internal clock.

Embodiment 4

Figure 7:
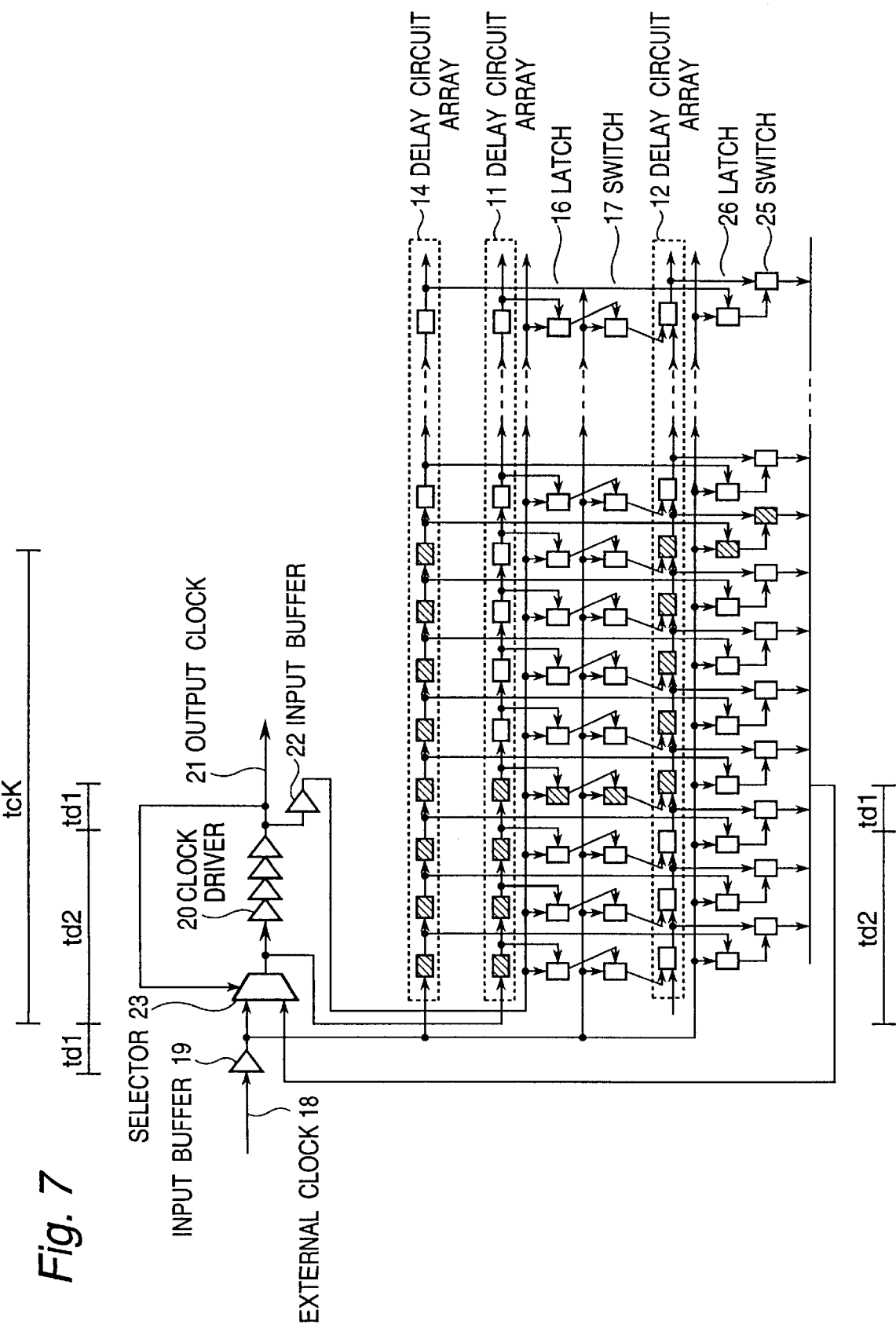
FIG. 7 is a circuit diagram illustrating the construction of a fourth embodiment of the synchronous delay circuit in accordance with the present invention.

FIG. 7 is a circuit diagram illustrating the construction of a fourth embodiment of the synchronous delay circuit in accordance with the present invention.

Figure 13:
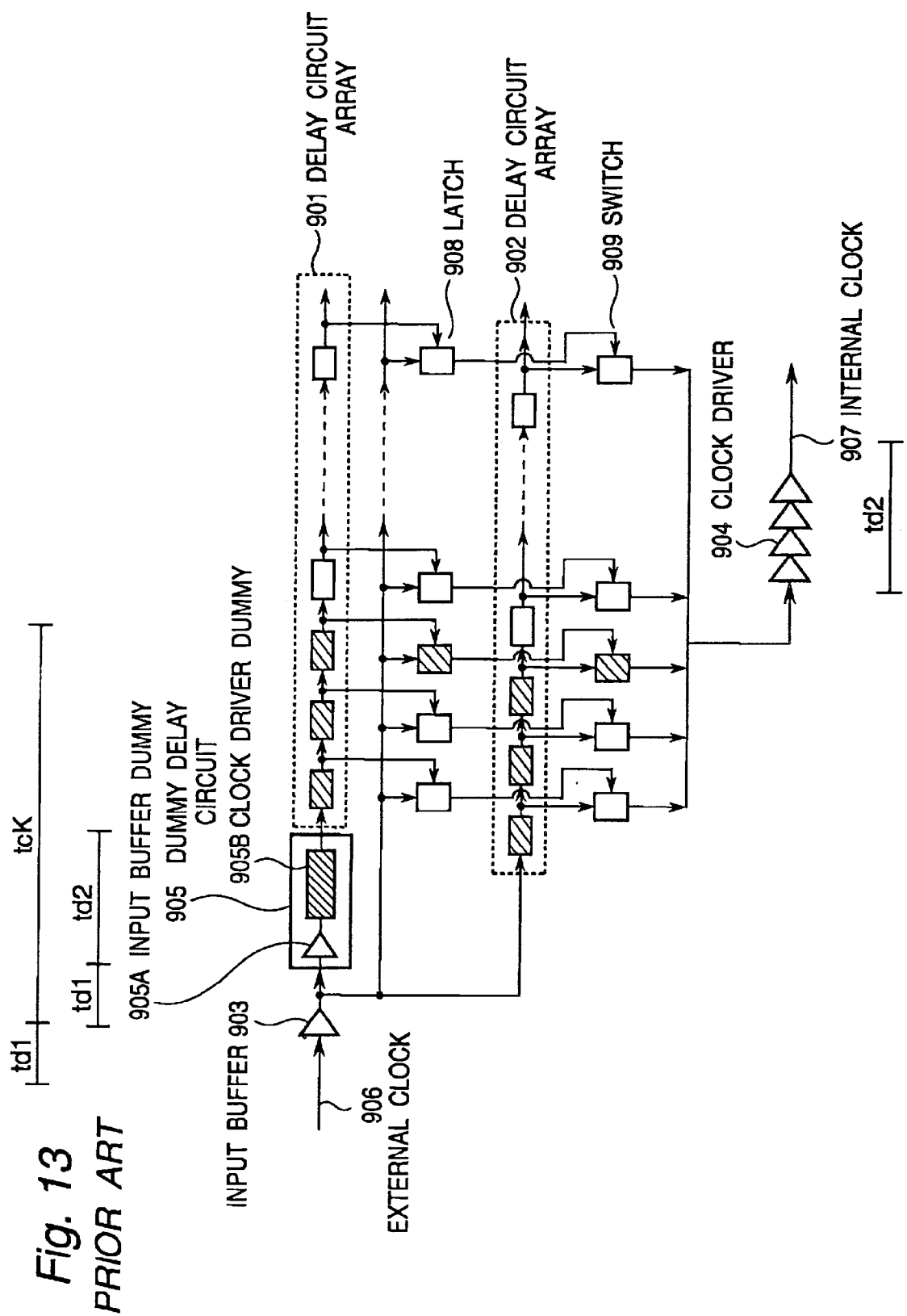
FIG. 13 is a circuit diagram illustrating the construction of a fifth example of the prior synchronous delay circuit.
Figure 15A:
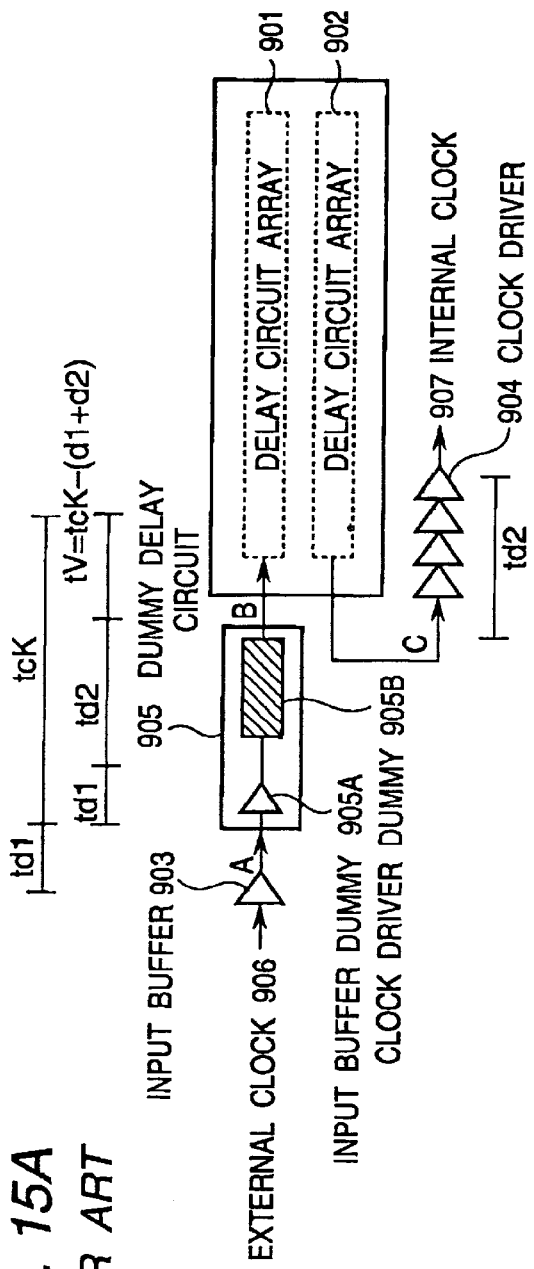
FIG. 15A is a circuit diagram illustrating the construction of a circuit having the prior art synchronous delay circuit.
Figure 15B:
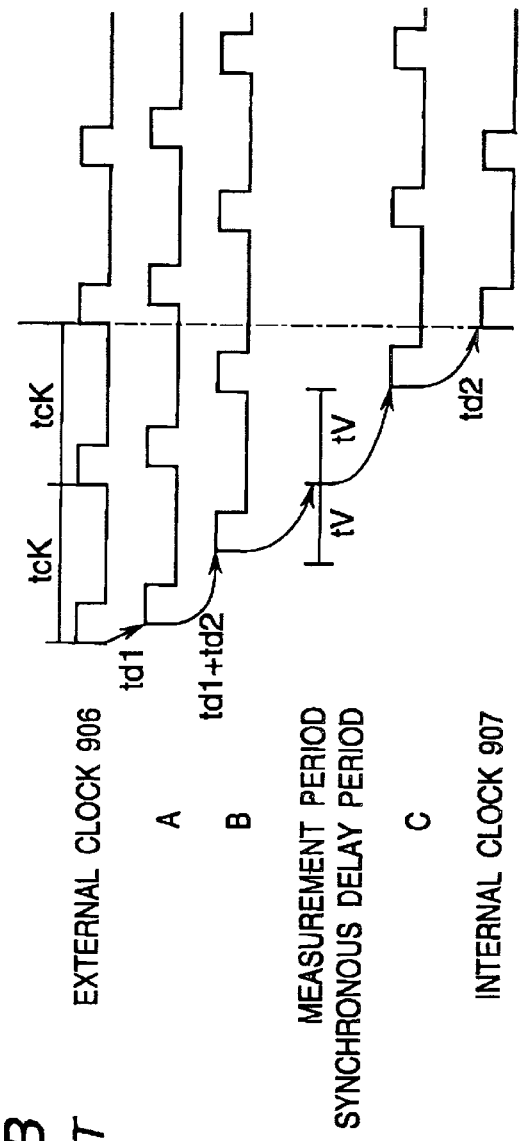
FIG. 15B is a timing chart of illustrating an operation of the circuit having the prior art synchronous delay circuit.
Figure 16A:
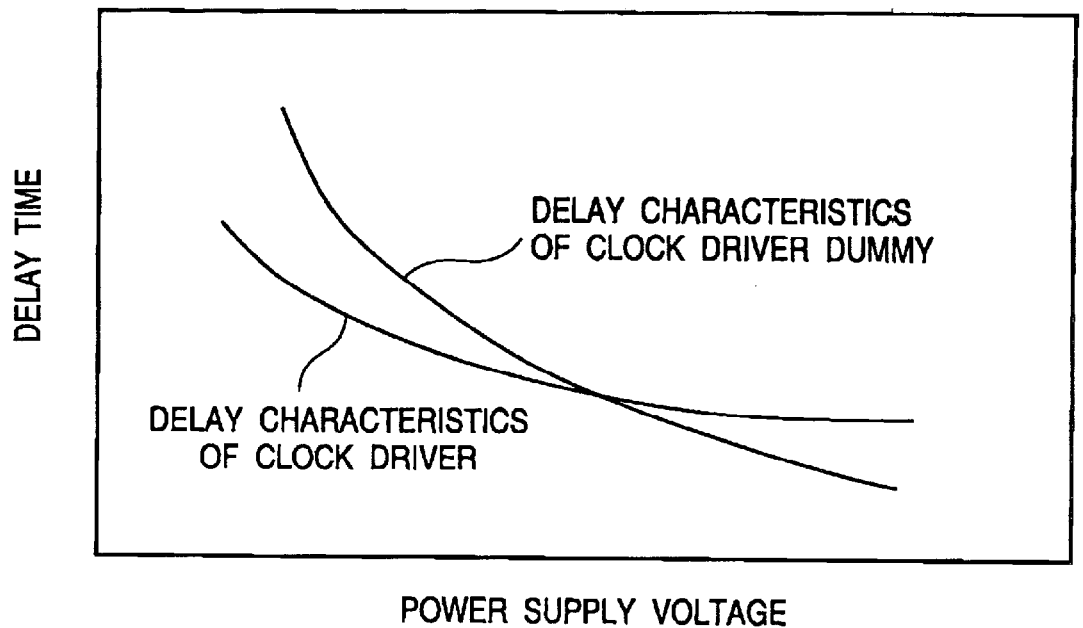
FIG. 16A is a graph for illustrating a delay characteristics of the dummy delay circuit and the clock driver, depending upon a power supply voltage.
Figure 16B:
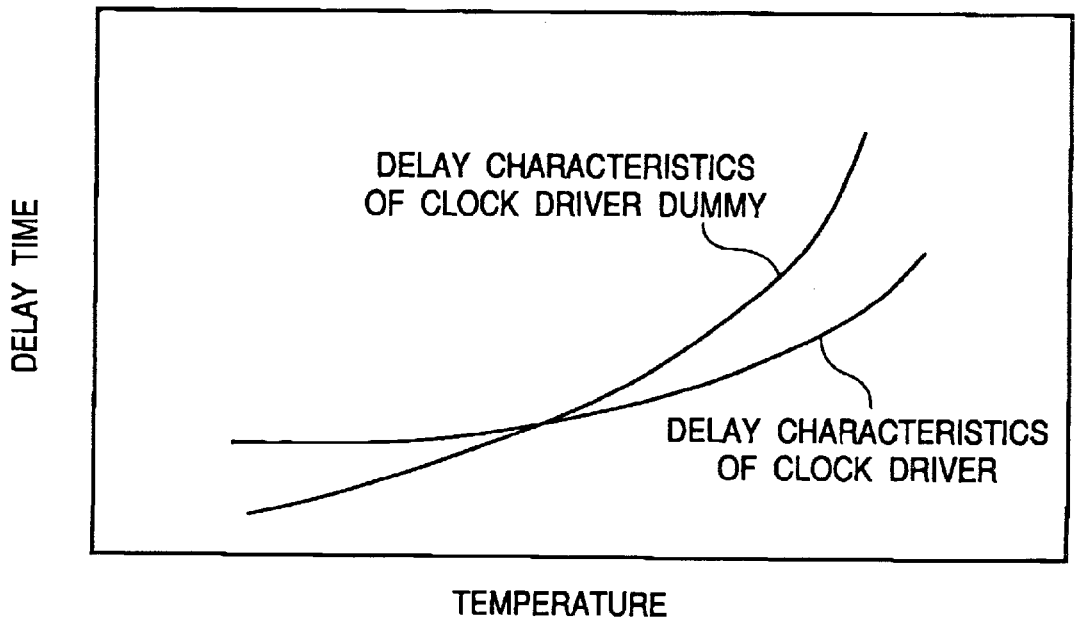
FIG. 16B is a graph for illustrating a delay characteristics of the dummy delay circuit and the clock driver, depending upon a temperature.

Referring to FIG. 7, the fourth embodiment adopts the system in which the delay circuit array 11 for measuring the clock period tcK and the delay circuit array 12 for reproducing the measured period are located in the same signal progressing direction. In the system in which the delay circuit array 11 and the delay circuit array 12 for reproducing the measured period are located in the same signal progressing direction, the clock pulse progresses in the delay circuit array 11, and when a next clock pulse is outputted from the input buffer 19, one is selected from outputs of the delay circuit array 12. This system corresponds to the system disclosed by the above referred document (2) 1996 Symp. on VLSI Circ. pp.112–113 and described with reference to FIG. 13, and therefore, the detail should be referred to the disclosure of the above referred document (2) 1996 Symp. on VLSI Circ. pp.112–113.

In this embodiment, the latch delay circuit is not clearly indicated, but the delay circuit array 15 for reproducing the measured period in the latch delay circuit 13 shown in FIG. 3 in connection with the first embodiment is in common to the delay circuit array 12 for reproducing the measured period. In addition, this embodiment includes a delay circuit array 14 for measurement, a delay circuit array 11, a delay circuit array 12, an array of switches 17 and an array of latch circuits 16 which determine an input terminal of the forward signal progressing direction delay circuit array 12 at a time point where the clock pulse has progressed in the measuring delay circuit array 14 by the delay times of the clock driver 20 and the input buffer 22, and an array of switches 25 and an array of latch circuits 26 which determine an output terminal of the forward signal progressing direction delay circuit array 12 at a time point where the clock pulse has progressed in the forward signal progressing direction delay circuit array 11 for measuring the clock period tcK.

Embodiment 5

Figure 8:
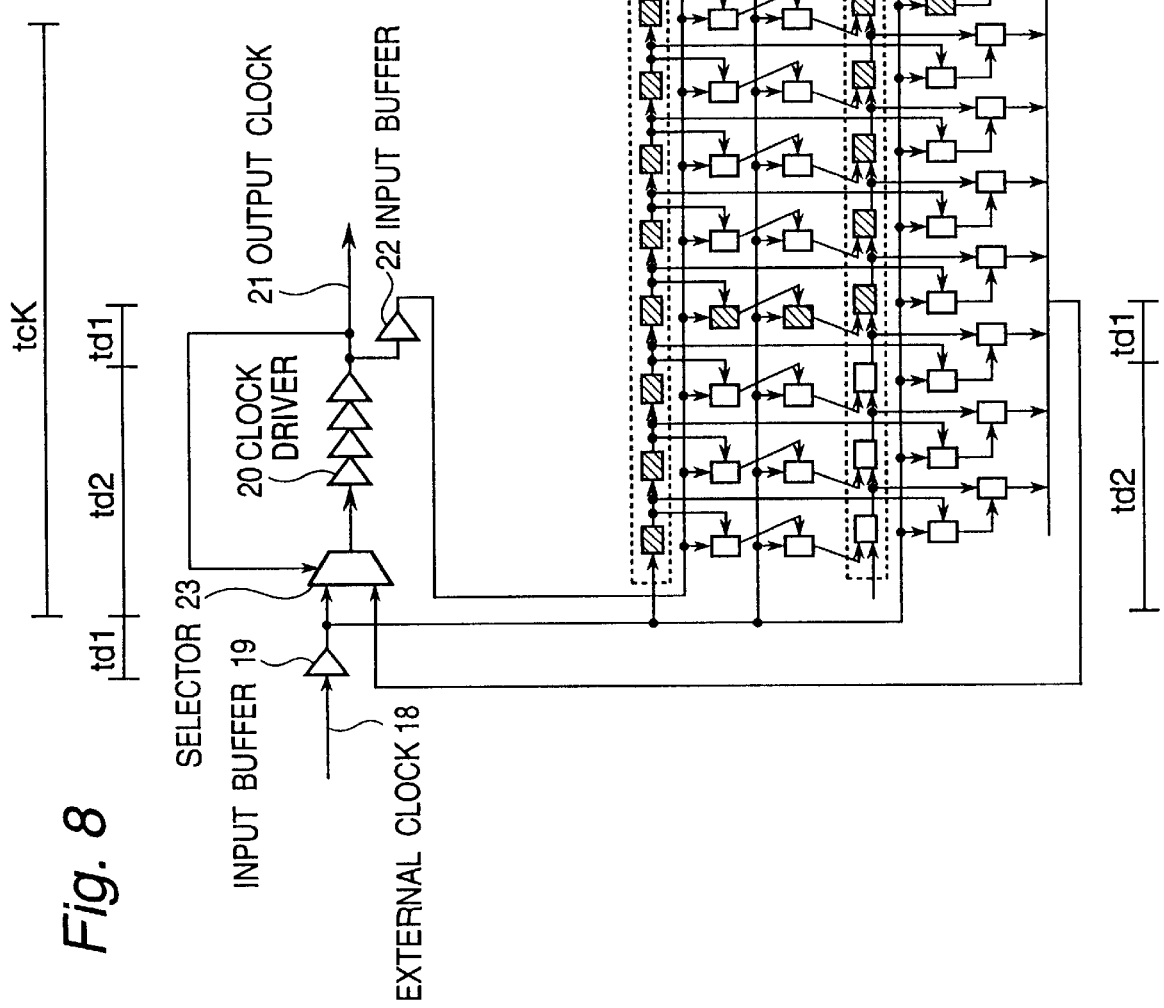
FIG. 8 is a circuit diagram illustrating the construction of a fifth embodiment of the synchronous delay circuit in accordance with the present invention.
Figure 9:
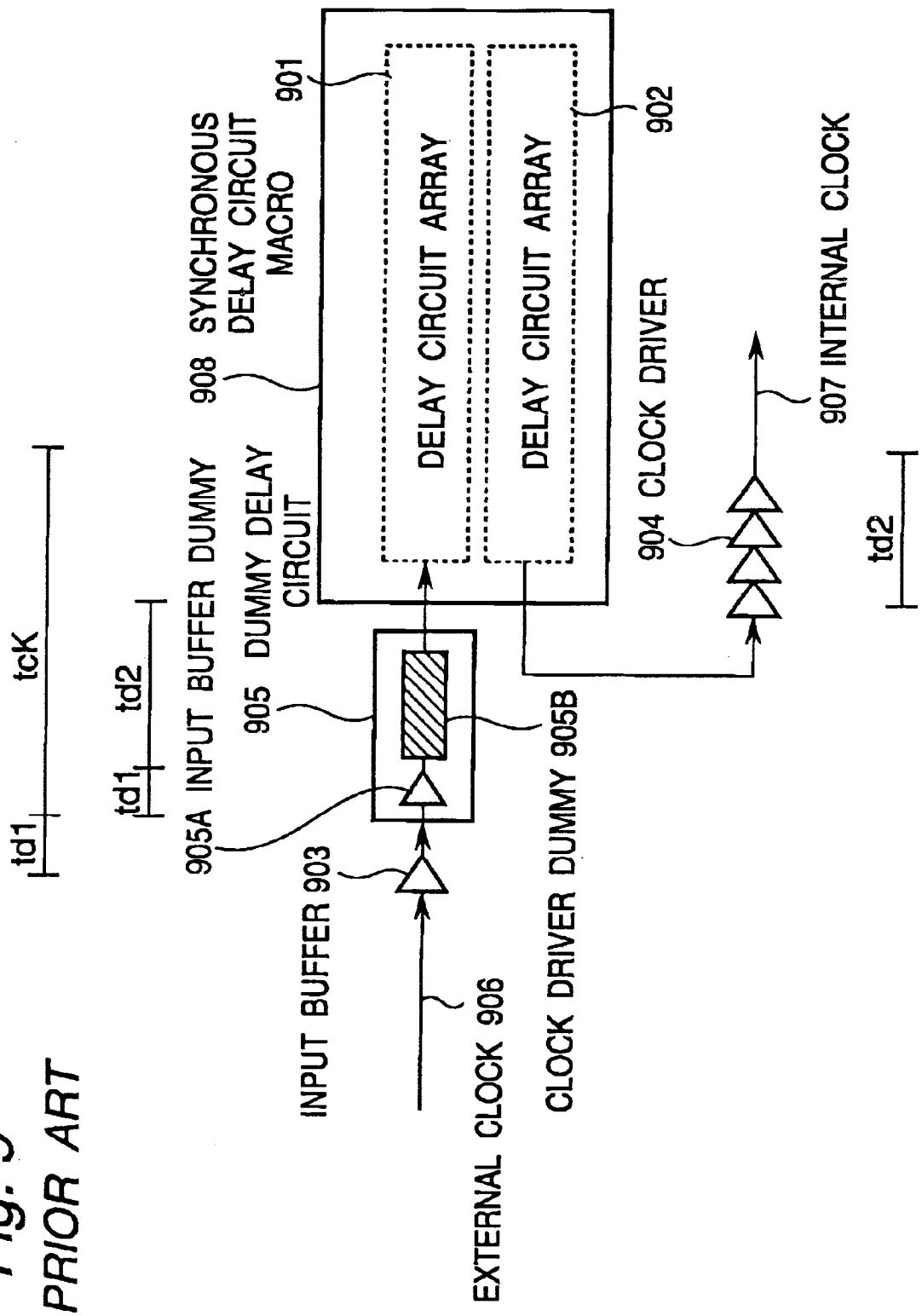
FIG. 9 is a circuit diagram illustrating the construction of a first example of the prior synchronous delay circuit.
Figure 10:
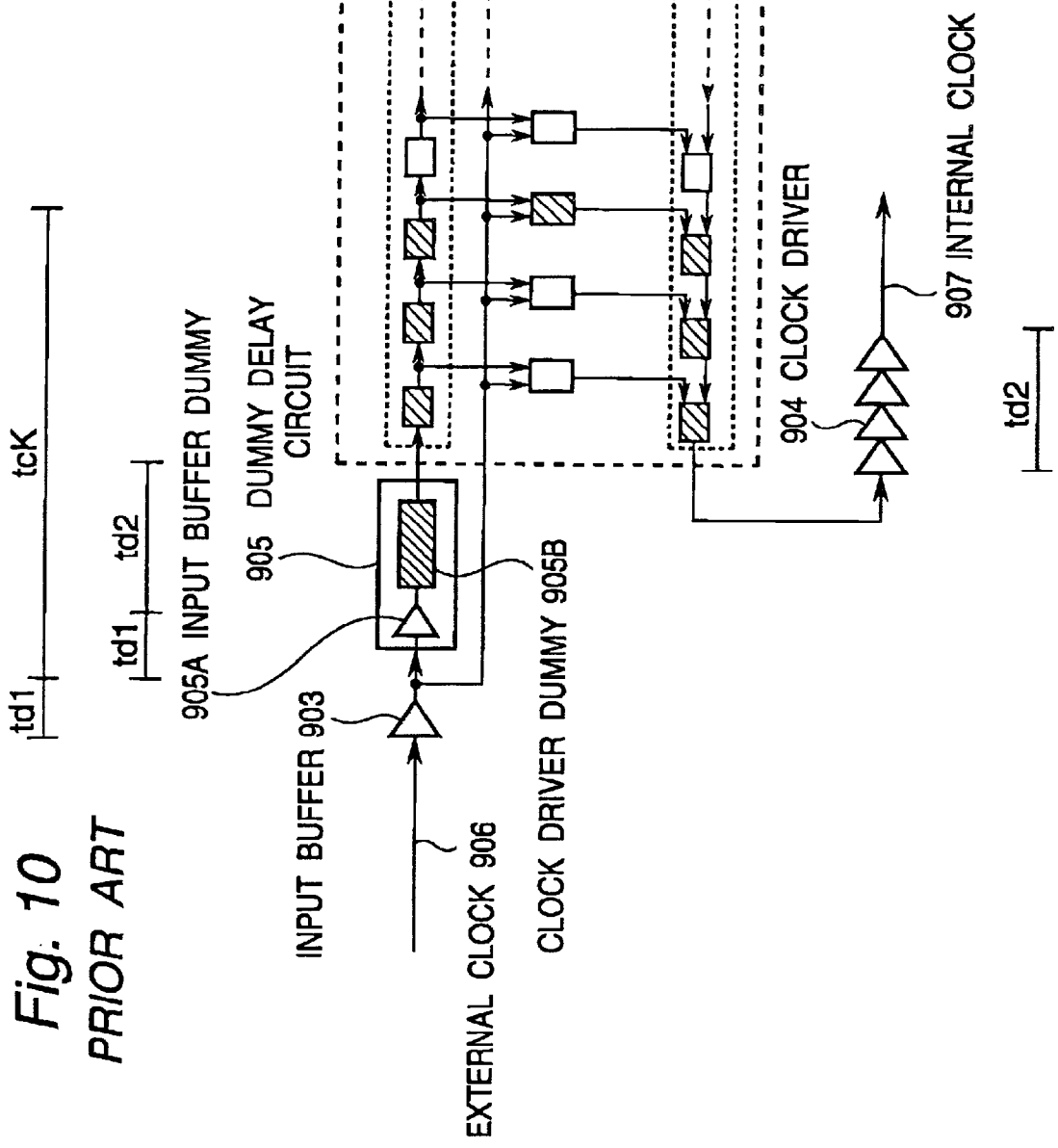
FIG. 10 is a circuit diagram illustrating the construction of a second example of the prior synchronous delay circuit.

FIG. 8 is a circuit diagram illustrating the construction of a fifth embodiment of the synchronous delay circuit in accordance with the present invention.

Referring to FIG. 8, the fifth embodiment adopts the system in which the delay circuit array 11 for measuring the clock period tcK and the delay circuit array 12 for reproducing the measured period are located in the same signal progressing direction. In the system in which the delay circuit array 11 and the delay circuit array 12 for reproducing the measured period are located in the same signal progressing direction, the clock pulse progresses in the delay circuit array 11, and when a next clock pulse is outputted from the input buffer 19, one is selected from outputs of the delay circuit array 12. This system corresponds to the system disclosed by the above referred document (2) 1996 Symp. on VLSI Circ. pp.112–113 and described with reference to FIG. 13, and therefore, the detail should be referred to the disclosure of the above referred document (2) 1996 Symp. on VLSI Circ. pp.112–113.

Referring to FIG. 8, in this embodiment, the latch delay circuit is not clearly indicated, but the delay circuit array 14 for measurement and the delay circuit array 15 for reproducing the measured period in the latch delay circuit 13 shown in FIG. 3 in connection with the first embodiment are in common to the delay circuit array 11 for measurement and the delay circuit array 12 for reproducing the measured period. In addition, in this embodiment, an array of switches 17 and an array of latch circuits 16 determine an input terminal of the forward signal progressing direction delay circuit array 12 at a time point (td1+td2) where the clock pulse has progressed in the measuring delay circuit array 11 by the delay times of the clock driver 20 and the input buffer 22, and an array of switches 15 and an array of latch circuits 26 determine an output terminal of the forward signal progressing direction delay circuit array 12 at a time point where the clock pulse has progressed in the forward signal progressing direction delay circuit array 11 for measuring the clock period tcK.

As mentioned above, the synchronous delay circuit in accordance with the present invention is characterized in that the period of the clock is measured by the progressing time of the clock pulse or the clock pulse edge, and the delay amount of the clock driver is stored in the latch circuit. At the time of measuring the clock period, the clock period including the delay amount of the clock driver is measured, but the measured period is reproduced by subtracting the delay amount of the clock driver from the clock period. Thus, the dummy delay circuit of the clock driver is no longer necessary. The synchronous delay circuit can be applied to the device such as ASIC having the clock delay amount different from one chip to another, and it is no longer necessary to design the clock driver dummy for each interconnection design modification. Therefore, a working efficiency is elevated, and the chip area can be effectively utilized.

In the synchronous delay circuit in accordance with the present invention, since the delay amount of the actual clock driver is directly measured, even if the delay amount of the actual clock driver varies upon the temperature change of the device, there is not clock skew caused by the difference in delay amount between the clock driver dummy and the original clock driver. Accordingly, precision and reliability can be elevated.

The invention has thus been shown and described with reference to the specific embodiments. However, it should be noted that the present invention is in no way limited to the details of the illustrated structures but changes and modifications may be made within the scope of the appended claims.

What is claimed is:

1. A synchronous delay circuit comprising:
  a clock driver;
  a synchronous delay circuit output;
  a first delay circuit array including a plurality of stages, an input at each of said stages, and an output at each of said stages, allowing a pulse or a pulse edge to progress during a constant time period;
  a second delay circuit array including a plurality of stages, an input at each of said stages, and an output at each of said stages, interconnected with said first delay circuit array, and allowing the pulse or the pulse edge to pass by a length in proportion to a length by which the pulse or the pulse edge has progressed in said first delay circuit array; and
  a circuit means interconnected with said first delay circuit array for storing and reproducing the period in which the clock pulse progresses in the clock driver; and
  a selector circuit interconnected with an input buffer, the clock driver, and an output of the second delay circuit.

2. A synchronous delay circuit claimed in claim 1 further including:
  an input buffer; and
  a structure, including said circuit means for storing and reproducing the period in which the clock pulse progresses in the clock driver, such that said first and second delay circuit arrays have signal progressing directions opposite to each other and the clock pulse progresses through said first delay circuit array, and when the clock pulse has progressed by a combined delay time of said clock driver and said input buffer, an output of said second delay circuit array in a reversed signal progressing direction is selectively connected to said synchronous delay circuit output, and when said clock pulse has progressed in said first delay circuit array by one clock period, an output of said first delay circuit array is selectively connected to an input of said second delay circuit array in a reversed signal progressing direction.

3. A synchronous delay circuit claimed in claim 1 further including:
  an input buffer;
  a third delay circuit array including a plurality of stages, an input at each of said stages, and an output at each of said stages; and
  a structure, including said circuit means for storing and reproducing the period in which the clock pulse progresses in the clock driver, such that said first and third delay circuit arrays have a forward signal progressing direction, and said second delay circuit array has a reverse signal progressing direction, and said third delay circuit array and a combined output of said clock driver and said input buffer selectively connecting an output of said second delay circuit array to said synchronous delay circuit output in response to a clock pulse progressing in said third delay circuit array, and said first delay circuit array and an output of said input buffer selectively connecting an output of said first delay circuit array to an input of said second delay circuit array in response to a clock pulse progressing in said first delay circuit array.

4. A synchronous delay circuit claimed in claim 1 further including;
   an input buffer; and
   a structure, including said circuit means for storing and reproducing the period in which the clock pulse progresses in the clock driver, such that said first and second delay circuit arrays have the same signal progressing direction, and said first delay circuit array a combined output of said clock driver and said input buffer selectively connecting an output of said first delay circuit array to an input of said second delay circuit array in response to a clock pulse progressing in said first delay circuit array, and said first delay circuit array and an output of said input buffer selectively connecting an output of said second delay circuit array to said synchronous delay circuit output in response to a clock pulse progressing in said first delay circuit array.

5. A synchronous delay circuit claimed in claim 1 further including:
   an input buffer;
   a third delay circuit array including a plurality of stages, an input at each of said stages, and an output at each of said stages; and
   a structure, including said circuit means for storing and reproducing the period in which the clock pulse progresses in the clock driver, such that said first, second and third delay circuit arrays have the same forward signal progressing direction, and said first delay circuit array and a combined output of said clock driver and said input buffer selectively connecting an output of said first delay circuit array to an input of said second delay circuit array in response to a clock pulse progressing in said first delay circuit array, and said third delay circuit array and an output of said input buffer selectively connecting an output of said second delay circuit array to said synchronous delay circuit output in response to a clock pulse progressing in said third delay circuit array.

6. A synchronous delay circuit configured to receive an external clock at an input buffer and to synchronize an internal clock signal output from a clock driver with said external clock, the synchronous delay circuit comprising:
   a first delay circuit array allowing a clock pulse to progress during a constant time;
   a second delay circuit array interconnected with said first delay circuit array, and allowing said clock pulse to pass by a length in proportion to a length by which said clock pulse has progressed in said first delay circuit array;
   a latch delay means interconnected with said first delay circuit array, and receiving said clock pulse from said input buffer and an output of said clock driver, for storing the period in which said clock pulse progresses in said clock driver, said latch delay means delaying said clock pulse from said input buffer by a delay time obtained by summing a delay time (td2) of said clock driver and a delay time (td1) of said input buffer, so as to supply the delayed clock pulse to said first delay circuit array; and
   a selector circuit interconnected with said input buffer, said clock driver, and an output of said second delay circuit array for selecting one of said clock pulse from said input buffer and an output signal of said second delay circuit array, to supply the selected one to said clock driver as a clock signal,
   wherein at a time point where said clock pulse output from said latch delay means has progressed in said first delay circuit array by a time (tcK−(td1+td2)) obtained by subtracting (td1+td2) from a clock period tcK, said clock pulse is transferred to said second delay circuit array, so that after said clock pulse has progressed in said second delay circuit array by the time (tcK−(td1+td2)), said clock pulse is output from said second delay circuit array and is supplied through said selector circuit to said clock driver, whereby said internal clock signal output from said clock driver is synchronized with said external clock input to said input buffer.

7. A synchronous delay circuit claimed in claim 6 wherein said latch delay means includes a third delay circuit array for allowing said clock pulse to progress during a constant time, and a fourth delay circuit array allowing said clock pulse to pass by a length in proportion to a length by which said clock pulse has progressed in said third delay circuit array; and
   wherein the synchronous delay circuit further includes a means for storing a position to which a signal to be supplied to said clock driver is input to said third delay circuit array and when said signal has progressed by the delay time (td2) of the clock driver in said third circuit array, for selecting an input terminal of said fourth delay circuit array corresponding to said position,
   so that said clock pulse from said input buffer is supplied to said selected input terminal of said fourth delay circuit array, and the signal which has progressed in said fourth delay circuit array is output from said fourth delay circuit array to said first delay circuit array through an input buffer dummy equivalent to said input buffer having a delay time td1.

8. A synchronous delay circuit configured to receive an external clock at an input buffer and to synchronize an internal clock signal output from a clock driver with said external clock, the synchronous delay circuit comprising:
   a synchronous delay circuit output;
   first and second delay circuit arrays, including a plurality of stages, an input at each of said stages, and an output at each of said stages, having signal progressing directions opposite to each other;
   said first and second delay circuit arrays being interconnected through a means for selectively connecting an output of said second delay circuit array to said synchronous delay circuit output at a time point where said clock pulse output from said input buffer has progressed in said first delay circuit array by a sum (td2+td1) of a delay time of said clock driver (td2) and a delay time of said input buffer (td1); and
   a means for selectively connecting an output of said first delay circuit array to an input of said second delay circuit array and receiving said clock pulse transferred from said first delay circuit array, at a time point where said clock pulse output from said input buffer has progressed in said first delay circuit array by one clock period tcK; and a selector circuit interconnected with an input buffer, the clock driver, and an output of the second delay circuit.

9. A synchronous delay circuit configured to receive an external clock at an input buffer and to synchronize an internal clock signal output from a clock driver with said external clock, the synchronous delay circuit comprising:

a synchronous delay circuit output;

first and second delay circuit arrays, including a plurality of stages, an input at each of said stages, and an output at each of said stages, having the same forward signal progressing direction;

a third delay circuit array, including a plurality of stages, an input at each of said stages, and an output at each of said stages, having a reversed signal progressing direction;

said first, second and third delay circuit arrays being interconnected through a means for selectively connecting an output of said third delay circuit array to said synchronous delay circuit output at a time point where said clock pulse output from said input buffer has progressed in said first delay circuit array by a sum (td2+td1) of a delay time of said clock driver (td2) and a delay time of said input buffer (td1); and a means for selectively connecting an output of said second delay circuit array to an input of said third delay circuit array and receiving said clock pulse transferred from said second delay circuit array, at a time point where said clock pulse outputted from said input buffer has progressed in said second delay circuit array by one clock period tcK.

10. A synchronous delay circuit configured to receive an external clock at an input buffer and to synchronize an internal clock signal output from a clock driver with said external clock, the synchronous delay circuit comprising:

a synchronous delay circuit output;

first and second delay circuit arrays, including a plurality of stages, an input at each of said stages, and an output at each of said stages, having the same forward signal progressing direction;

said first and second delay circuit arrays being interconnected through a means for selectively connecting an output of said first delay circuit array to an input of said second delay circuit array at a time point where said clock pulse output from said input buffer has progressed in said first delay circuit array by a sum (td2+td1) of a delay time of said clock driver (td2) and a delay time of said input buffer (td1); and a means for selectively connecting an output of said second delay circuit array to said synchronous delay circuit output, at a time point where said clock pulse output from said input buffer has progressed in said first delay circuit array by one clock period tcK; and a selector circuit interconnected with an input buffer, the clock driver, and an output of the second delay circuit.

11. A synchronous delay circuit configured to receive an external clock at an input buffer and to synchronize an internal clock signal output from a clock driver with said external clock, the synchronous delay circuit comprising:

a synchronous delay circuit output;

first, second and third delay circuit arrays, including a plurality of stages, an input at each of said stages, and an output at each of said stages, having the same signal progressing directions;

said first, second and third delay circuit arrays being interconnected through a means for selectively connecting an output of said second delay circuit array to an input of said third delay circuit array at a time point where said clock pulse output from said input buffer has progressed in said second delay circuit array by a sum (td2+td1) of a delay time of said clock driver (td2) and a delay time of said input buffer (td1); and a means for selectively connecting an output of said third delay circuit array to said synchronous delay circuit output, at a time point where said clock pulse outputted from said input buffer has progressed in said first delay circuit array by one clock period tcK.

* * * * *

UNITED STATES PATENT AND TRADEMARK OFFICE
CERTIFICATE OF CORRECTION

PATENT NO. : 6,222,408 B1
DATED : April 24, 2001
INVENTOR(S) : Takanori Saeki

It is certified that error appears in the above-identified patent and that said Letters Patent is hereby corrected as shown below:

<u>Column 3,</u>
Line 22, delete "td1-td2" insert -- td1 + td2 --

Signed and Sealed this

Twenty-ninth Day of January, 2002

Attest:

JAMES E. ROGAN
*Attesting Officer*     *Director of the United States Patent and Trademark Office*